(12) United States Patent
Brown et al.

(10) Patent No.: US 6,680,647 B2
(45) Date of Patent: Jan. 20, 2004

(54) LOW NOISE AMPLIFIER CIRCUIT WITH PHASE MATCHED SWITCH TOPOLOGY

(75) Inventors: Edward Russel Brown, Sunnyvale, CA (US); Michael Louis Frank, Los Gatos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 39 days.

(21) Appl. No.: 10/020,258

(22) Filed: Dec. 13, 2001

(65) Prior Publication Data

US 2003/0112065 A1 Jun. 19, 2003

(51) Int. Cl.[7] .............................................. H03F 1/14
(52) U.S. Cl. ....................... 330/51; 330/53; 330/150; 330/151; 330/157; 330/124; 330/302; 330/310
(58) Field of Search .................... 330/51, 151, 150, 330/53, 157, 302, 311, 124, 278, 310

(56) References Cited

U.S. PATENT DOCUMENTS

| | | | | |
|---|---|---|---|---|
| 5,532,650 A | * | 7/1996 | Igarashi | 330/300 |
| 5,661,434 A | * | 8/1997 | Brozovich et al. | 330/51 |
| 6,043,721 A | * | 3/2000 | Nagode et al. | 332/117 |
| 6,118,338 A | | 9/2000 | Frank et al. | 330/51 |
| 6,118,989 A | * | 9/2000 | Abe et al. | 455/127.2 |
| 6,127,886 A | * | 10/2000 | Khabbaz et al. | 330/51 |
| 6,141,561 A | * | 10/2000 | Izumiyama | 455/553.1 |
| 6,208,202 B1 | * | 3/2001 | Kaufman et al. | 330/51 |
| 6,356,150 B1 | * | 3/2002 | Spears et al. | 330/145 |
| 6,381,286 B1 | * | 4/2002 | Wilkinson et al. | 375/296 |

FOREIGN PATENT DOCUMENTS

JP          2002208865 A  *  7/2002  .............. H04B/1/10

* cited by examiner

*Primary Examiner*—Michael Tokar
*Assistant Examiner*—Linh Van Nguyen

(57) ABSTRACT

An amplifier and bypass switch circuit includes a circuit input, a circuit output, an amplifier and a switching circuit. The amplifier has an amplifier control input, and a first amplifier output. The amplifier control input is connected to the circuit input. The amplifier output is connected to the circuit output. The switching circuit includes a control input, a switch input, a switch output and a phase matching network. The switch output is connected to the circuit output. The switch input is connected to the circuit input. The phase matching network preserves phase information when the amplifier and bypass switch circuit switches between an amplifier mode and a bypass mode.

11 Claims, 1 Drawing Sheet

LOW NOISE AMPLIFIER CIRCUIT WITH PHASE MATCHED SWITCH TOPOLOGY

BACKGROUND

The present invention concerns circuits used for communication systems and pertains specifically to a low noise amplifier circuit with a phase matched switch topology.

Modern digital wireless systems, such as those used in cellular phones and local area networks (LANs) utilize signals with a frequency typically in the range of 0.5 gigahertz (GHz) to 6.0 GHz.

For strong transmission signals, for example when there is a relatively short transmission distance, it is often advantageous to use a switch or series of switches to bypass a microwave amplifier in order to conserve power and lower system gain. The microwave amplifier, while important to achieve high dynamic range for weak transmission signals, may be unnecessary for strong transmission signals. Providing a bypass of the microwave amplifier allows the system gain to be lowered when the input signal is strong.

U.S. Pat. No. 6,118,338 describes an amplifier with a switched bypass path where an R-C matching network in the bypass path matches the input and output impedance of the bypass path on the amplifier mode impedance. However, the circuit described in U.S. Pat. No. 6,118,338 does not make an attempt to match the S21 through phase of the bypass path to the S21 through phase in the amplifier mode. Some radio modulation schemes use the phase information of a signal to transmit data. In these phase modulated systems, it is desirable to maintain the same through phase when switching between the bypass path and the amplifier mode so the phase information is not lost during the path change.

SUMMARY OF THE INVENTION

In accordance with the preferred embodiment of the present invention, an amplifier and bypass switch circuit includes a circuit input, a circuit output, an amplifier and a switching circuit. The amplifier has an amplifier control input, and a first amplifier output. The amplifier control input is connected to the circuit input. The amplifier output is connected to the circuit output. The switching circuit includes a control input, a switch input, a switch output and a phase matching network. The switch output is connected to the circuit output. The switch input is connected to the circuit input. The phase matching network preserves phase information when the amplifier and bypass switch circuit switches between an amplifier mode and a bypass mode.

DESCRIPTION OF THE PREFERRED EMBODIMENT

Figure 1:
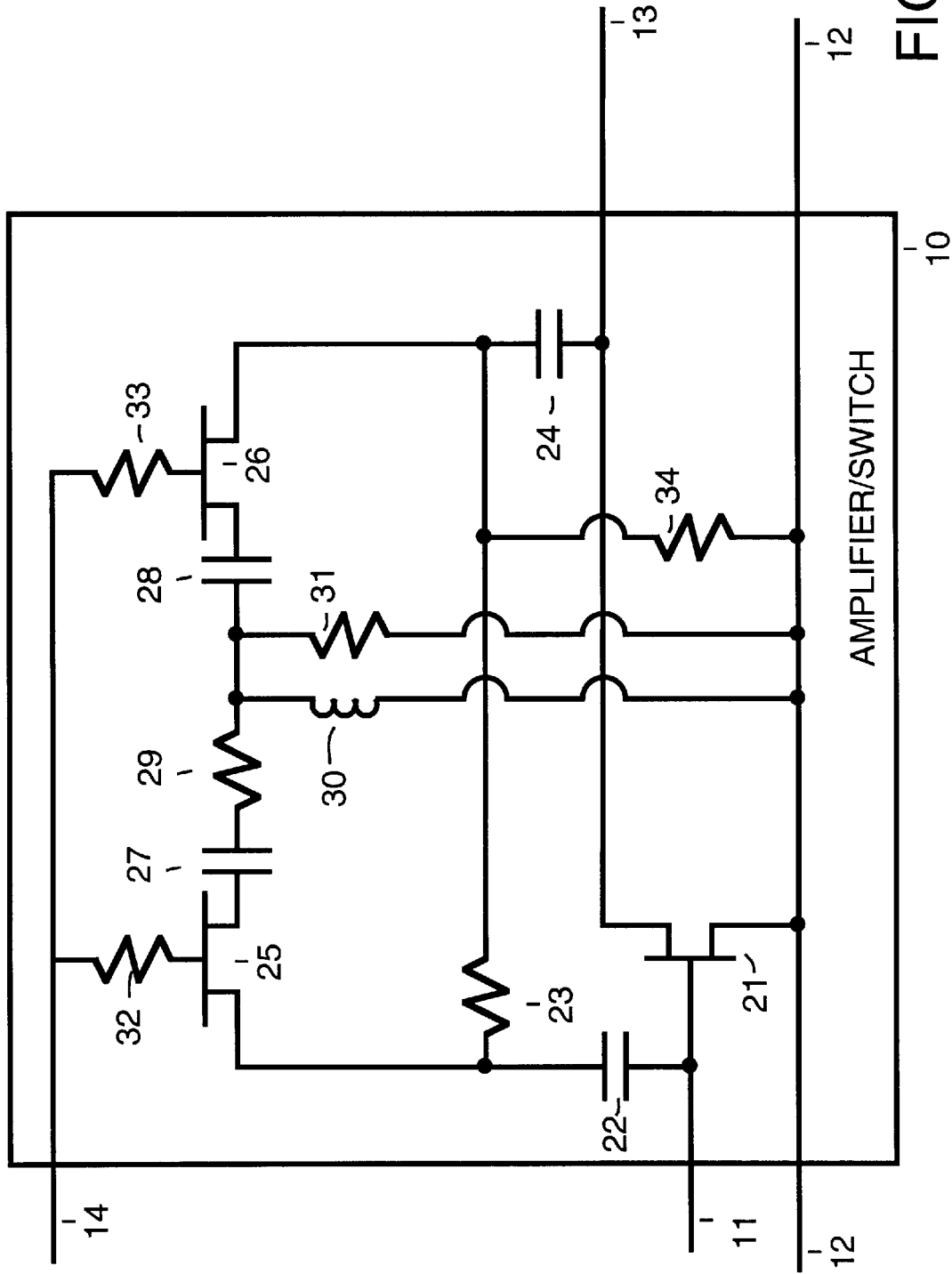
FIG. 1 is a schematic of a circuit of an amplifier circuit with a phase matched switch topology in accordance with a preferred embodiment of the present invention.

FIG. 1 is a schematic of an amplifier/switch circuit 10 that is an amplifier that includes a switch bypass. On a circuit input 11 is placed a radio frequency (RF) input signal. A DC component (Vg) on circuit input 11 is DC biased at a gate voltage of, for example, 0.5 volts in amplifier mode, and at 0 volts in bypass mode. A ground input 12 functions as a ground voltage for AC signals. A DC component of ground input 12 is at 0 volts.

A control input 14 receives a DC control voltage (Vc) for amplifier/switch 10. When the control voltage (Vc) on control input 14 is at 0 volts and circuit input 11 is at 0.5 volts, amplifier/switch 10 is in amplifier mode. When the control voltage (Vc) on control input 14 is at 1 volt and circuit input 11 is at 0 volts DC, amplifier/switch 10 is in bypass mode.

An RF output 13 is an RF output for amplifier/switch 10. A DC output drain voltage of 3 volts is placed on RF output 13. In the amplifier mode, amplifier/switch 10 amplifies the RF input signal on circuit input 11 to produce the RF output signal on RF output 13. In the bypass mode, amplifier/switch 10 forwards the RF input signal on circuit input 11 to RF output 13 without amplification.

Amplifier/switch 10 includes an enhancement mode field-effect transistor (FET) 21, a capacitance 22, a resistance 23, a capacitance 24, an FET 25, a resistance 32, a capacitance 27, a capacitance 28, a resistance 29, an FET 26, a resistance 33, a resistance 34 a capacitance 24, an inductance 30 and a resistance 31, connected as shown in FIG. 1.

In the amplifier mode, amplifier/switch 10 is in gain mode and draws current. The signal is routed through the amplifier FET 21, and is amplified accordingly. In this state, the switch FET 25 and switch FET 26 are in the high impedance mode, and do not allow significant signal through, and present a very high impedance, and so do not contribute to the circuit characteristics.

In the bypass mode, a voltage difference across FET 25 and FET 26 is sufficient to cause the bypass path to open.

The feedback, consisting of capacitance 22 and resistance 23, is utilized for two functions. As a feedback path, the capacitance functions only to stop the voltage at the drain node of FET 21 from showing up at the gate of FET 21. The resistance provides the actual feedback signal, and is designed simply to make the amplifier more stable. In this implementation, the feedback is very light specifically to minimize the effect on the noise contribution. The second function of the feedback is to deliver the reference voltage equally to switch FET 25 and switch FET 26. Resistance 34 connects the reference bias of the switch FETs 25 and 26 to 0 volts at ground input 12.

In the bypass mode, FET 21 is turned off by the control voltage at circuit input 11, and so FET 21 is now high impedance and has no effect on the impedance of the switch amplifier. The loss in the amplifier FET 21 is large, so there is insignificant signal flow through it. The signal is routed through capacitance 22, through FET 25, through capacitance 27, through resistance 29, through capacitance 28, through FET 26, and through capacitance 24. Inductance 30 and resistance 31 are connected in shunt as shown. The resulting bypass matching network presents similar impedance to that presented by the FET 21 when in the gain mode. In addition, the bypass matching network accomplishes phase matching so that phase information is maintained when amplifier/switch 10 is switched between bypass mode and amplifier mode.

The preservation of phase information when switching between the amplifier mode and the bypass mode is useful in some receivers systems that require the phase information to be maintained during switching. The preferred embodiment has the advantage of maintaining the S21 phase match as well as the input and output match when switched between the amplifier mode and the bypass mode. Preservation of phase match is an advantage over prior art circuits.

When integrating the R-L-C matching network on an integrated circuit, inductance 30 can be integrated in the integrated circuit when there is a fixed phase match. Alternatively, inductance 30 can be added external to the integrated circuit so that the value of inductance 30 may be adjusted to shift the frequency of the phase matching.

In the preferred embodiment of the present invention, FET 25 is, for example, a 300 micron enhancement mode FET. FET 26 is, for example, a 300 micron enhancement mode FET. FET 21 is, for example, a 300 micron enhancement mode FET. Capacitance 22 is, for example, a 3 picofarad (pF) capacitor. Capacitance 27 is, for example, a 0.4 picofarad (pF) capacitor. Capacitance 28 is, for example, a 0.6 picofarad (pF) capacitor. Capacitance 24 is, for example, a 3 picofarad (pF) capacitor. Resistance 29 is, for example, a 20 ohm resistor. Resistor 23 is, for example a 2.5 kilohm resistor. Resistance 32 is, for example a 5 kilohm resistor. Resistance 33 is, for example, a 5 kilohm resistor. Resistance 31 is, for example a 750 ohm resistor. Resistance 34 is for example, a 6 kilohm resistor. For phase matching at an input signal frequency of 1960 MHz inductance 30 is a 6.0 nano Henry (nH) inductor.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. An amplifier and bypass switch circuit comprising:
    a circuit input;
    a circuit output;
    an amplifier having an amplifier control input, and a first amplifier output, the amplifier control input being connected to the circuit input, and the amplifier output being connected to the circuit output; and,
    a switching circuit including:
        a control input,
        a switch input connected to the circuit input,
        a switch output connected to the circuit output, and
        a phase matching network, the phase matching network preserving through phase information when the amplifier and bypass switch circuit switches between an amplifier mode and a bypass mode.

2. An amplifier and bypass switch circuit as in claim 1, wherein the phase matching network includes an inductance/resistance/capacitance (LRC) circuit.

3. An amplifier and bypass switch circuit as in claim 1, additionally comprising:
    a feedback resistance connected through a first capacitance to the circuit input and through a second capacitance to the circuit output.

4. An amplifier and bypass switch circuit as in claim 1, wherein the amplifier and bypass switch circuit is completely implemented on an integrated circuit.

5. An amplifier and bypass switch circuit as in claim 1, wherein the amplifier and bypass switch circuit is completely implemented on an integrated circuit except that the phase matching network includes an inductance which is external to the integrated circuit.

6. An amplifier and bypass switch circuit comprising:
    a circuit input;
    a circuit output;
    an amplifier having an amplifier control input, and a first amplifier output, the amplifier control input being connected to the circuit input, and the amplifier output being connected to the circuit output; and,
    a switching circuit having a switch control input, a switch input and a switch output, the switch output being connected to the circuit output and the switch control input being connected to the circuit input;
    wherein, when a control signal on the switch control input is at a first voltage level, the switching circuit places the amplifier and bypass switch circuit control into an amplifier mode in which the amplifier amplifies an input signal on the circuit input to produce an output signal on the circuit output;
    wherein, when the control signal on the switch control input is at a second voltage level, the switching circuit places the amplifier and bypass switch circuit control into a bypass mode in which the input signal on the circuit input is forwarded to the output signal on the circuit output bypassing the amplifier; and
    wherein the switching circuit preserves through phase information when the amplifier and bypass switch circuit switches between the amplifier mode and the bypass mode.

7. An amplifier and bypass switch circuit as in claim 6, wherein the switching circuit includes an inductance/resistance/capacitance (LRC) circuit.

8. An amplifier and bypass switch circuit as in claim 6, additionally comprising:
    a feedback resistance connected through a first capacitance to the circuit input and through a second capacitance to the circuit output.

9. An amplifier and bypass switch circuit as in claim 6 wherein the switching circuit comprises:
    a first transistor having a gate, a drain and a source, the drain being connected through a first capacitor to the circuit input;
    a second transistor having a gate, a drain and a source, the drain of the second transistor being connected through a second capacitor to the circuit output;
    a first resistor being connected between the gate of the first transistor and the switch control input;
    a third capacitor having a first end and a second end, the first end being connected to the source of the first transistor;
    a second resistor having a first end and a second end, the first end being connected to the second end of the third capacitor;
    an inductance being connected between the second end of the second resistor and the circuit ground;
    a third resistor being connected between the second end of the second resistor and the circuit ground; and,
    a fourth capacitor being connected between the second end of the second resistor and the source of the second transistor.

10. An amplifier and bypass switch circuit as in claim 9, additionally comprising:
    a feedback resistance connected through the first capacitance to the circuit input and through the second capacitance to the circuit output.

11. An amplifier and bypass switch circuit as in claim 9, wherein the amplifier and bypass switch circuit comprises a third transistor having a source, a gate and a drain, the gate of the third transistor being connected to the circuit input, the drain of the third transistor being connected to the circuit output and the source of the third transistor being connected to the circuit around.

* * * * *

UNITED STATES PATENT AND TRADEMARK OFFICE
CERTIFICATE OF CORRECTION

PATENT NO.    : 6,680,647 B2
DATED         : January 20, 2004
INVENTOR(S)   : Brown, Edward Russel It is certified that error appears in the above-identified patent and that said Letters Patent is hereby corrected as shown below:

<u>Title page,</u>
Item [75], delete "Edward Russel Brown" insert -- Edward Russell Brown --

Signed and Sealed this

Eighteenth Day of May, 2004

JON W. DUDAS
*Acting Director of the United States Patent and Trademark Office*